United States Patent [19]

Lerner et al.

[11] Patent Number: 5,381,042
[45] Date of Patent: Jan. 10, 1995

[54] PACKAGED INTEGRATED CIRCUIT INCLUDING HEAT SLUG HAVING AN EXPOSED SURFACE

[75] Inventors: Steve P. Lerner, Soquel, Calif.; David S. Razu, Garland, Tex.

[73] Assignee: Amkor Electronics, Inc., Payoli, Pa.

[21] Appl. No.: 231,341

[22] Filed: Apr. 19, 1994

Related U.S. Application Data

[63] Continuation of Ser. No. 861,736, Mar. 31, 1992, abandoned.

[51] Int. Cl.⁶ ............................................. H01L 23/02
[52] U.S. Cl. .................................... 257/712; 257/722
[58] Field of Search .............. 257/707, 720, 706, 675, 257/712, 713, 720, 722

[56] References Cited

U.S. PATENT DOCUMENTS

| | | | |
|---|---|---|---|
| 4,107,727 | 8/1978 | Ikezawa et al. | 257/793 |
| 4,410,927 | 10/1983 | Butt . | |
| 4,461,924 | 7/1984 | Butt . | |
| 4,480,262 | 10/1984 | Butt . | |
| 4,594,770 | 6/1986 | Butt . | |
| 4,737,395 | 4/1988 | Mabuchi et al. . | |
| 4,773,955 | 9/1988 | Mabuchi et al. . | |
| 4,888,449 | 12/1989 | Crane et al. . | |
| 4,949,220 | 8/1990 | Tashiro . | |
| 4,975,761 | 12/1990 | Chu . | |
| 4,994,936 | 2/1991 | Hernandez . | |
| 5,028,741 | 7/1991 | Sanders et al. | 257/788 |
| 5,041,902 | 8/1991 | McShane | 257/706 |
| 5,105,259 | 4/1992 | McShane et al. | 257/707 |

*Primary Examiner*—Andrew J. James
*Assistant Examiner*—S. V. Clark
*Attorney, Agent, or Firm*—Skjerven, Morrill, MacPherson, Franklin & Friel

[57] ABSTRACT

A low cost electronic device package having greatly improved heat dissipation capability. The package includes a heat slug, preferably formed from oxygen-free high-conductivity copper, that has a surface exposed outside the package. A simplified and inexpensive manufacturing method is described using a "drop in" technique. Using this technique, the size and shape of the heat slug is dependent only on the size and shape of the mold cavity; the package may have any number of leads and any size die. The heat slug is preferably formed with fins around its circumference so that the slug is self-aligning when it is dropped into the mold cavity. Preferably, slots are formed through the heat slug to provide improved encapsulant flow during the encapsulation process and interlocking between slug and encapsulant in the finished package. The heat slug may have at least one toughened surface on its circumference that interlocks with the encapsulant, helping to hold the heat slug in place and preventing contaminants from migrating to the interior of the package. Formation of encapsulant bleed or flash on the exposed heat slug surface are prevented by providing a dimensional mismatch between the heat slug and leadframe, and the corresponding height of the mold cavity that causes the leadframe tie bars to force the heat slug exposed surface against the mold cavity surface, producing a tight seal so that encapsulant is prevented from coming between those two surfaces.

16 Claims, 6 Drawing Sheets

PACKAGED INTEGRATED CIRCUIT INCLUDING HEAT SLUG HAVING AN EXPOSED SURFACE

This application is a continuation of Ser. No. 07/861,736 filed Mar. 31, 1992, now abandoned.

BACKGROUND OF THE INVENTION

1. Field of the Invention

This invention relates to electronic device packaging and, in particular, to the formation of a package including a heat slug. More particularly, this invention relates to the formation of a package with a heat slug via a "drop-in" technique such that a surface of the heat slug is exposed to the exterior of the package.

2. Related Art

In early semiconductor packaging, the integrated circuit was typically packaged either in a metal can or between a ceramic lid and base. Metallic and ceramic packaging materials both provided excellent thermal properties, but each also necessitated expensive and time consuming packaging techniques and materials. For example, the two ceramic substrates used in ceramic packages comprised a sizeable percentage of the total cost of manufacturing the component.

Figures 1A, 1B:
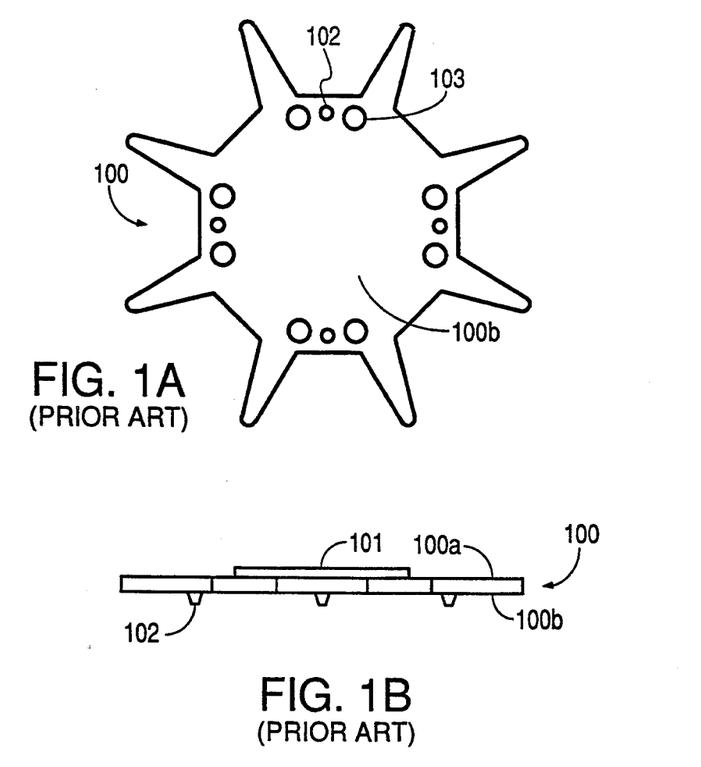
FIGS. 1A and 1B are a plan view and side view, respectively, of a prior art heat spreader.

As semiconductor production volumes grew, the need for more cost effective packages grew also. Several new packaging approaches were developed. The most notable was the plastic molded package. However, though the plastic package provided significant cost savings, the advantageous thermal properties present with the use of metallic or ceramic materials were lacking. As integrated circuit speed and density increased, the need for improved thermal performance (i.e., improved dissipation of heat) became more important. This need motivated the inclusion of a metallic heat sink within the package to remove heat from the semiconductor die area.

several approaches that attempt to improve heat dissipation in this way have been tried, the most common being incorporation of a heat spreader into the package. Typically, heat spreaders have been made of aluminum. FIGS. 1A and 1B show a plan view and side view, respectively, of a prior art heat spreader 100. Die attach pad attachment surface 101 of the heat spreader 100 is raised above base surface 100a. Legs 102 extend from base surface 100b that is opposite base surface 100a. Through holes 103 are formed at locations around the periphery of the heat spreader 100.

Figure 2:
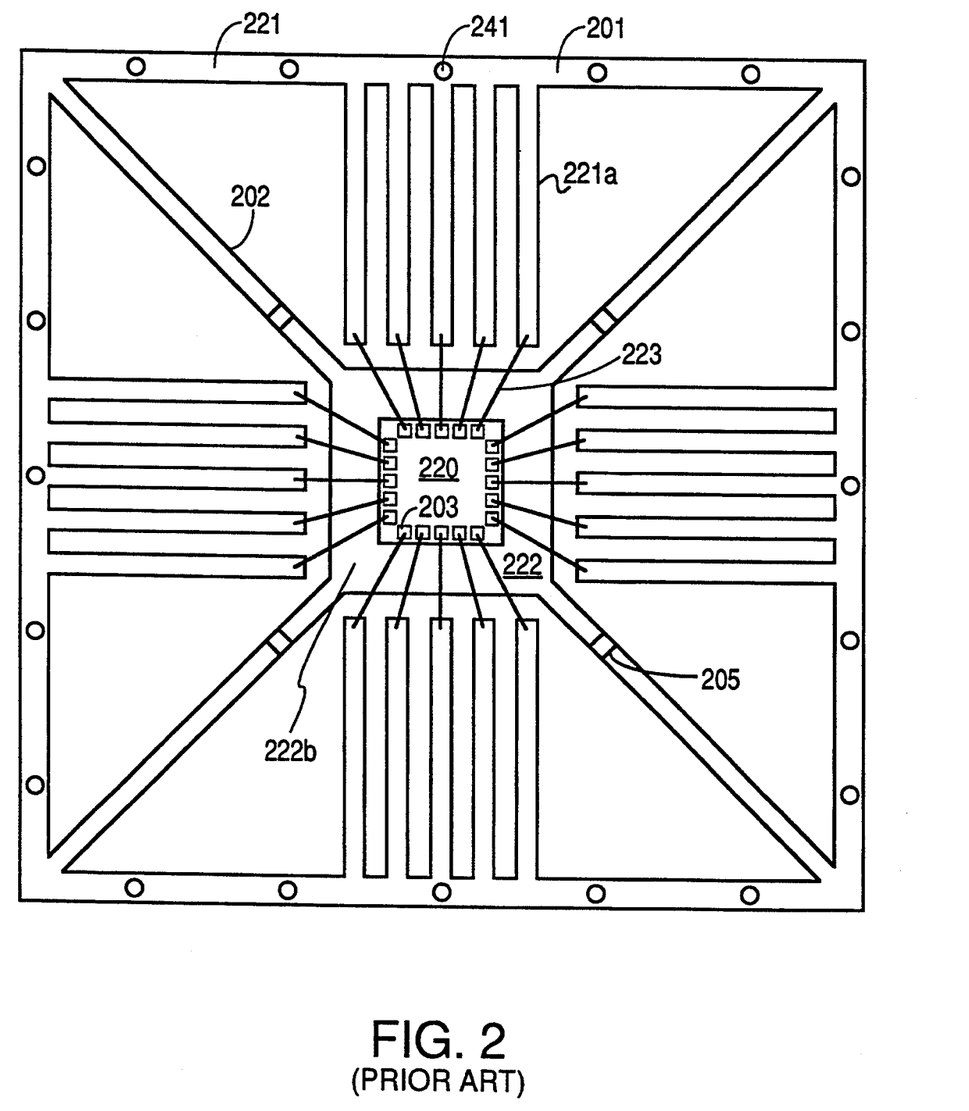
FIG. 2 is a plan view of a semiconductor die mounted on a leadframe.

FIG. 2 shows a plan view of a semiconductor die 220 mounted on a leadframe 221. The leadframe 221 is comprised of a frame 201, leads 221a, tie bars 202 and die attach pad 222. Holes 241 are formed at spaced apart locations in the frame 201. The die attach pad 222 is formed in the center of the leadframe 221. The die 220 is attached to a surface 222b of the die attach pad 222. Tie bars 202 connect the die attach pad 222 to the frame 201. Tie bar downsets 205 facilitate flexure of the tie bars 202. The leads 221a are formed circumferentially around the die attach pad 222. The leads 221a extend from the frame 201 toward the die attach pad 222, but they do not touch it. This is so that, in the finished package the leads 221a may be electrically isolated from the die attach pad 222. This electrical isolation is accomplished, after the integrated circuit is encapsulated, by cutting off the frame 201, leaving extended and unconnected leads 221a and tie bars 202. Bond wires 223 connect the interior end of each of the leads 221a to selected die contact pads 203, providing electrical connection from the integrated circuit on the die 220 to electrical components outside the package.

Figure 3:
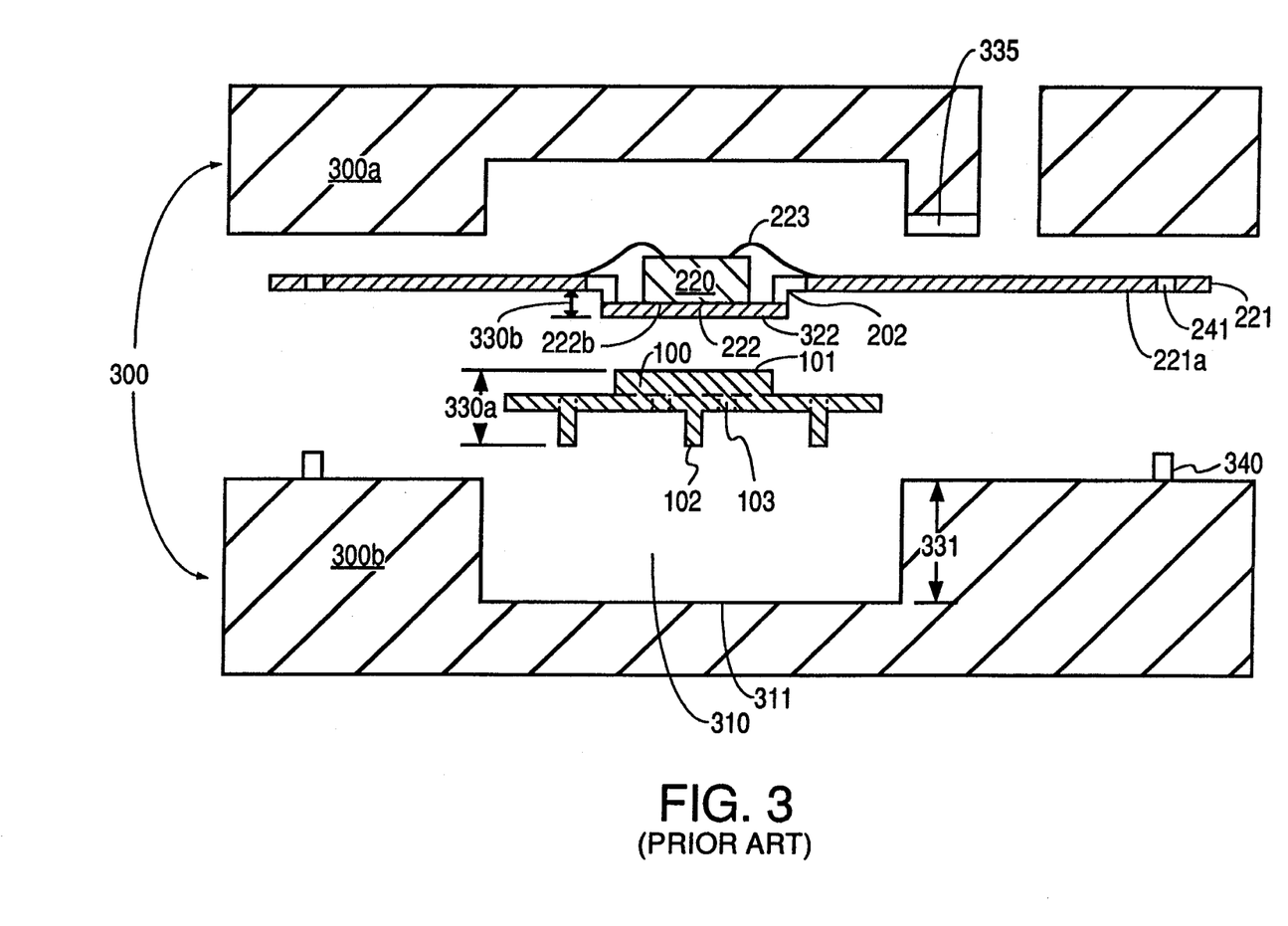
FIG. 3 is a cross-sectional view of the heat spreader of FIGS. 1A and 1B, a leadframe, and a semiconductor die disposed in a mold cavity.

FIG. 3 shows a cross-sectional view of the heat spreader 100, leadframe 221, and die 220 disposed in the mold cavity 310 of a mold 300. In one method of encapsulating an integrated circuit with heat spreader, the heat spreader 100 is "dropped in" the mold cavity 310 so that legs 102 contact surface 311. The die 220 is attached to the die attach pad attachment surface 222b of the leadframe 221. Bond wires 223 are used to electrically connect the leads 221a to selected bond pads (not shown) on the die 220. The leadframe 221, die 220 and bond wires 223 are then placed in the mold cavity 310, as shown in FIG. 3, so that surface 322 of the die attach pad 222 contacts the die attach pad attachment surface 101 of the heat spreader 100. The leadframe 221 is mounted to the mold half 301 by placing the holes 241 in the frame 201 over the pins 340.

The two mold halves 300a, 300b are closed together. The combination of the thickness 330a of the heat spreader 100 and the dimension 330b is greater than the corresponding height 331 of the mold cavity 310. Therefore, when the two mold halves 300a, 300b are fully closed together, the die attach pad 222 will be pushed upward, causing the tie bars 202 to be bent upward. This upward pull on the tie bars 202 gives rise to tensile forces which act to pull down the end of the tie bars 202 adjacent the die attach pad 222. Consequently, the heat spreader 100 is forced against the mold cavity surface 311 so that it is held in place.

After the mold 300 is closed, encapsulant is transferred into the mold cavity 310 through the channel 335 until the cavity 310 is full. When the encapsulant solidifies, the mold 300 is opened and the completed package removed.

Packages with heat spreaders as described above do not provide the level of heat dissipation required by newer generations of integrated circuit assemblies. Heat spreaders work by transferring heat to the outer regions of the package after the heat is transmitted from the die to the heat spreader. From these outer regions, the heat is then transferred through the encapsulant to the exterior of the package. Since the heat spreader material (e.g., aluminum) is more conductive than plastic encapsulant, heat is dissipated more quickly from the package interior than it would be if the spreader were not present. This turns out, however, not to be fast enough.

Other approaches to the problem of heat dissipation from integrated circuit packages have attempted to expose the surface of the heat sink opposite the die attach pad attachment surface directly to the exterior of the package, thereby greatly reducing the thermal resistance attributable to the presence of the plastic encapsulant. These attempts have been unsuccessful when used with the "drop in" technique due to various manufacturing difficulties. The high pressures present within the mold cavity during the encapsulation process, characteristics of the encapsulant material (e.g., viscosity), and dimensional variations from piece to piece between particular heat sinks have combined to produce separation between the surfaces of the heat sink and mold cavity during encapsulation. This inadequate sealing allows encapsulant bleed (the undesirable presence of translucent encapsulant) or flash (the undesirable presence of encapsulant greater in thickness than bleed and visible to the naked eye) formation on the heat sink surface that was intended to be exposed. Bleed and flash are undesirable both because they degrade the heat transfer capability of the heat sink and because they are undesirable cosmetic defects that most customers will not accept in the finished product. This unwanted plastic necessitates extensive and expensive cleaning of the heat sink surface prior to subsequent processing operations.

SUMMARY OF THE INVENTION

In accordance with the invention, there is provided an integrated circuit or circuits, or hybrid circuit or circuits, in a low cost plastic encapsulated package having greatly improved heat dissipation capability through the reduction of thermal resistance. The reduction of thermal resistance is accomplished by providing a heat slug in the package such that a surface of the heat slug with large area relative to the exterior surface area of the package is exposed outside the package to allow heat to be transferred out of the package. The heat slug is preferably formed from oxygen-free high-conductivity copper.

Further in accordance with the invention, a method is described for forming such a package using a "drop in" technique that allows simplified and inexpensive manufacture of the package. For packages formed according to this method, the size and shape of the heat slug is dependent only on the size and shape of the mold cavity. For a given mold cavity, the same heat slug may be used for packages having any number of leads and any size die. The heat slug is also preferably formed with fins around the circumference of the slug so that the slug is self-aligning when it is dropped into the mold cavity.

In another embodiment according to the invention, the heat slug surface facing the die attach pad is coated with an adhesive before the heat slug is dropped into the mold cavity.

In another embodiment according to the invention, at least one surface on the circumference of the heat slug is roughened. The roughened surface interlocks with the encapsulant material surrounding the heat slug to create an improved seal between the encapsulant and heat slug. The roughened surface also creates a longer interface between the heat slug and surrounding encapsulant so that potential contaminants must travel a longer distance from outside the package to reach the interior semiconductor die. The improved seal between the encapsulant and heat slug also helps reduce the migration of contaminants to the interior of the package.

In another embodiment according to the invention, slots are formed through the heat slug. The slots allow the heat slug to interlock with a surrounding material to prevent the slug from dislodging from that material. The slots also provide improved encapsulant flow during the encapsulation process.

Further in accordance with the invention, a method is provided for manufacturing the packages described above so that encapsulant bleed or flash does not occur on the exposed surface of the heat slug. A dimensional mismatch between the heat slug and leadframe, and the corresponding height of the mold cavity, causes tensile forces to be produced in the leadframe tie bars when the mold is fully closed. These tensile forces in the tie bars force the die attach pad against the heat slug so that the heat slug is, in turn, forced against a mold cavity surface. The method produces a tight seal between the exposed heat slug surface and the mold cavity surface during molding so that encapsulant is prevented from coming between those two surfaces.

DETAILED DESCRIPTION OF THE PREFERRED EMBODIMENTS

In the description that follows, aspects of the invention are described as they apply to a package containing a single integrated circuit. It is to be understood, however, that the invention is equally applicable to packages containing a plurality of integrated circuits. Further, a package according to the invention may also be constructed with or without underlying or interactive interconnect circuitry composed of polymer laminate, ceramic, silicon, or metal, or a mixture of these materials.

Figure 4A:
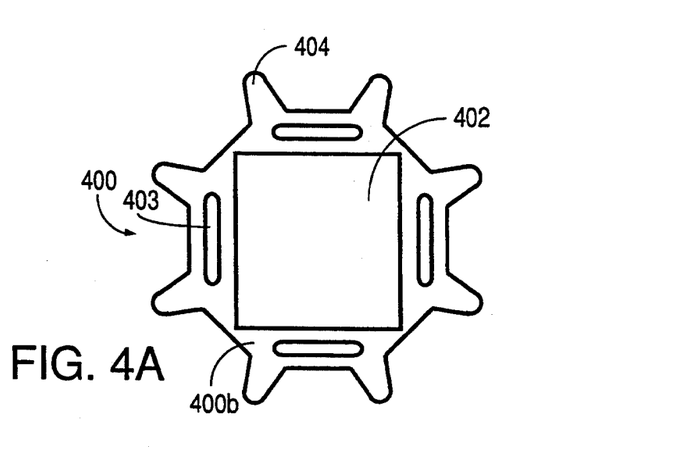
FIGS. 4A and 4B are a plan view and side view, respectively, of a heat slug according to an embodiment of the invention.
Figure 4B:
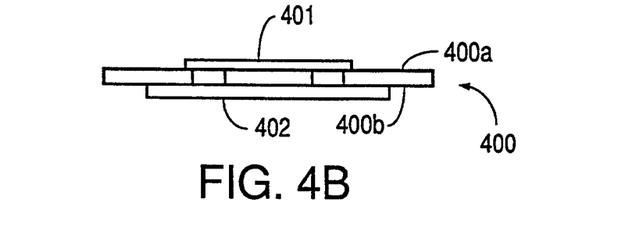

FIGS. 4A and 4B show a plan view and side view, respectively, of a heat slug 400 according to an embodiment of the invention. The heat slug 400 is preferably made of a highly thermally conductive material, e.g., oxygen-free high-conductivity copper. The heat slug 400 may also be made of aluminum, copper, beryllia or any alloy containing these materials. Die attach pad attachment surface 401 is raised above base surface 400a. Surface 402 is likewise raised above base surface 400b. Surface 402 has a large area relative to the base surface 400b and remains exposed in the completed package. The heat slug 400 with exposed surface 402 contrasts with the prior art heat spreader 100 shown in FIGS. 1A and 1B, in which only the set of legs 102 extending from the base surface 100b may remain exposed outside the package. The heat slug 400 also has slots 403 extending through the slug 400, and fins 404 formed as shown in FIG. 4A.

Figure 5:
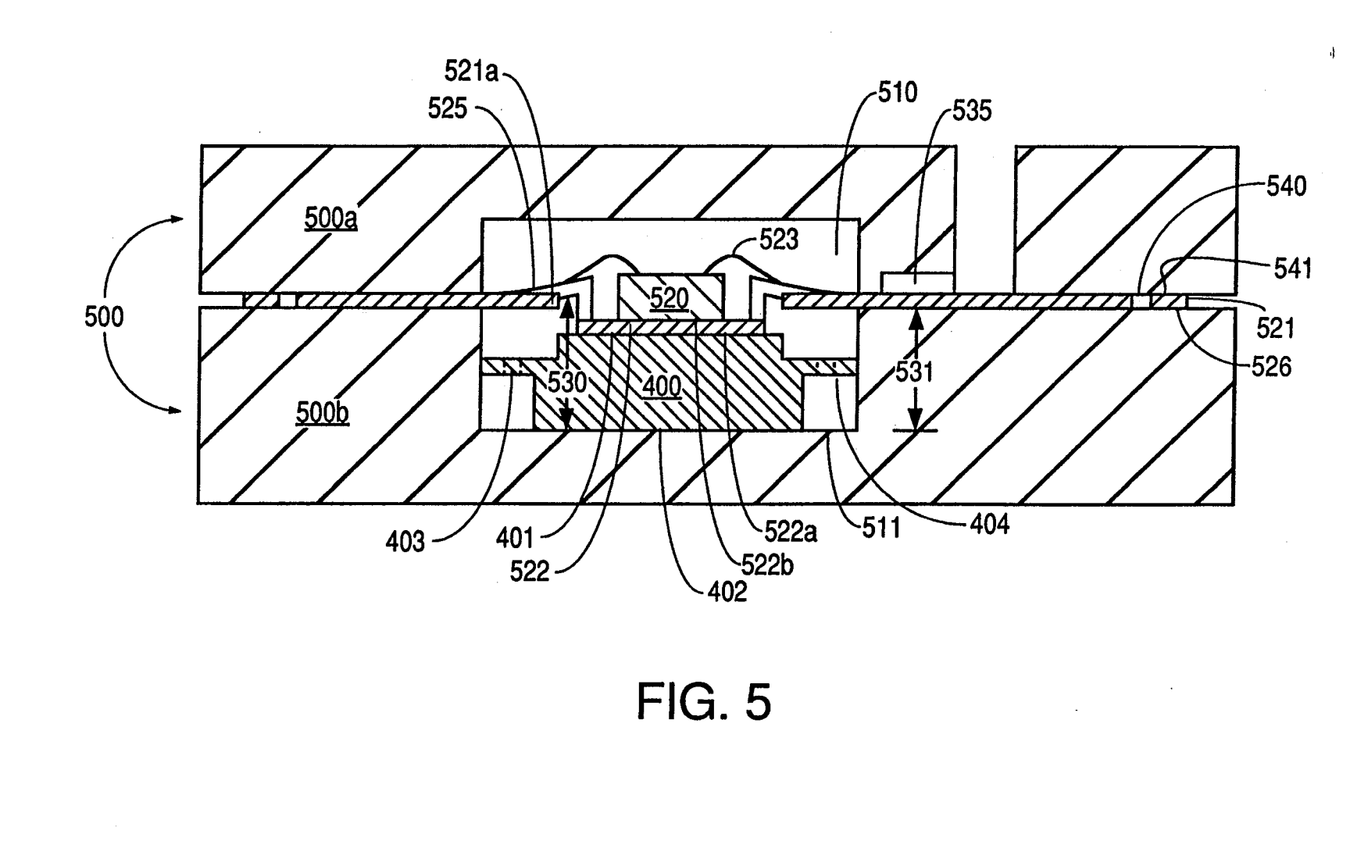
FIG. 5 is a cross-sectional view of the heat slug of FIGS. 4A and 4B, a leadframe, and a semiconductor die disposed in the mold cavity of a closed mold.

FIG. 5 shows a cross-sectional view of the heat slug 400, a leadframe 521, and a semiconductor die 520 disposed in the mold cavity 510 of a fully closed mold 500. The frame 526, leads 521a, tie bars 525, die attach pad 522, semiconductor die 520, and bond wires 523 are all related in the same manner as the corresponding elements described above with respect to FIGS. 2 and 3.

In producing an integrated circuit package, the heat slug 400 is dropped into the mold cavity 510 so that the surface 402 of the heat slug 400 contacts mold cavity surface 511. In production, heat slugs 400 may be dropped into the mold cavity 510 either individually or as a matrix array corresponding to chase cavity matrices. The slugs 400 may also be dropped into the cavity 510 by a coin-stack type dispenser. When the slug 400 is dropped into the cavity 510, it is automatically aligned with respect to the die attach pad 522 and die 520 by the fins 404. Because of the presence of the fins 404, the slug 400 cannot rotate in the cavity 510. The manufacturing specifications for the heat slug 400 (in particular, the size) are dependent only on the characteristics of the mold cavity 510. For a given mold cavity 510, the same heat slug 400 may be used with electronic components having any die size and any number of leads.

As before, the die 520 is attached to the die attach pad surface 522b and the leads are connected to the die 520 by the bond wires 523. This assembly is then placed in the mold cavity 510 so that the surface 522a of the die attach pad 522 contacts the die attach pad attachment surface 401 of the heat slug 400. The leadframe 521 is mounted on the mold half 500b by placing the holes 541 in the frame 526 over the pins 540.

The two mold halves 500a, 500b are closed together. The dimension 530 is greater than the corresponding height 531 of the mold cavity 510. This dimensional mismatch causes the tie bars 525 to be bent upward, as shown in FIG. 5, when the mold 500 is fully closed. This upward pull causes tensile forces in the tie bars 525 which act to pull down the end of the tie bars 525 adjacent the die attach pad 522. Consequently, the heat slug surface 402 is forced against the mold cavity surface 511, holding the heat slug 400 in place and resulting in a tight seal between the heat slug 400 and the mold surface 511.

When the mold 500 is closed as shown in FIG. 5, encapsulant is transferred into the mold cavity 510 through the channel 535 until the cavity 510 is full. The presence of the slots 403 enhances the encapsulant flow around the heat slug 400 by allowing encapsulant to flow from one side of the slug 400 to the other through an additional path that would not otherwise exist. Further, due to the tight seal between the heat slug surface 402 and the mold cavity surface 510, no encapsulant enters the region between those two surfaces so that no bleed or flash will form on the surface 402 when the encapsulant solidifies. Bleed and flash are minimized, too, because of the development of encapsulant compounds with better characteristics (e.g., lower viscosity, better fillers) than those previously used and because of the implementation of computer control of molding process parameters (e.g., compound velocity, transfer pressure, etc.).

When the encapsulant solidifies, the mold 500 is opened and the package removed. The frame portion 526 of the leadframe is cut off, leaving individual leads 521a and tie bars 525 extending from the package. The sections of the tie bars 525 exposed outside the package are cut back so that no portions of the tie bars 525 extend from the completed package.

Figure 6:
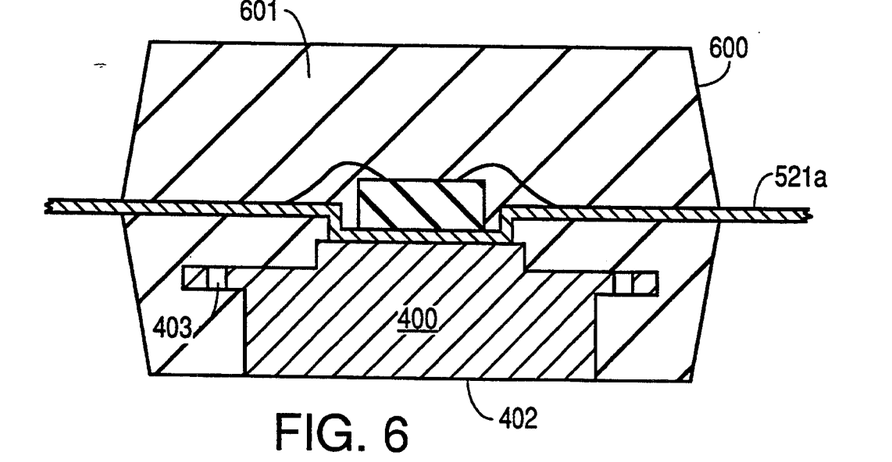
FIG. 6 is a cross-sectional view of an integrated circuit package according to an embodiment of the invention.

FIG. 6 shows a cross-sectional view of a completed package 600. In the completed package 600, the heat slug surface 402 is exposed to the exterior of the package 600. The slots 403 allow interlocking of the solid encapsulant 601 and heat slug 400 to help prevent the slug 400 from popping out of the package 600.

Figure 7A:
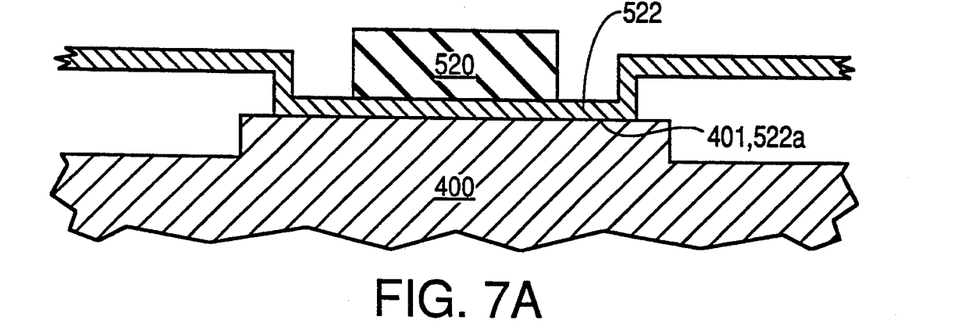
FIGS. 7A and 7B are cross-sectional views of the connection between a heat slug and die attach pad according to alternative embodiments of the invention.
Figure 7B:
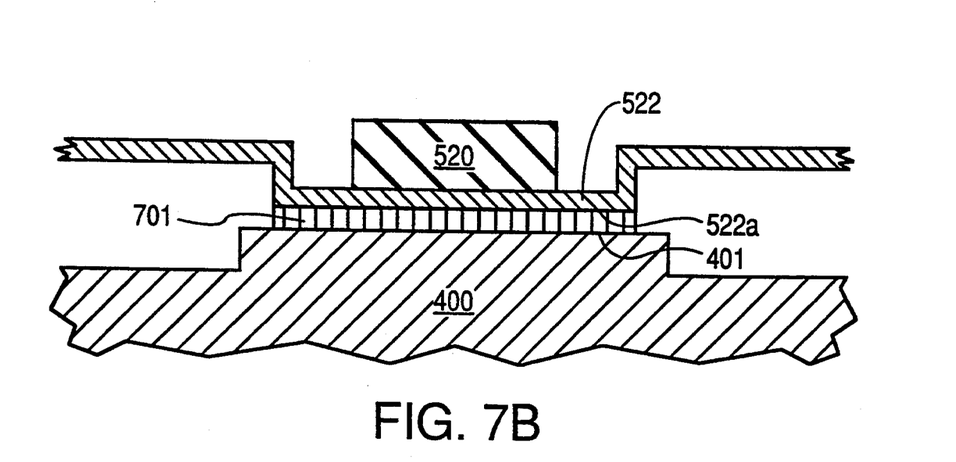

FIG. 7A shows a detailed view of the connection between the semiconductor die 520, die attach pad 522 and heat slug 400 according to the embodiment of the invention just described. In an alternative embodiment of the invention, the heat slug surface 401 could first be coated with an adhesive material (such as a b-stage epoxy) prior to contact with the die attach pad surface 522a. Preferably, the adhesive material is electrically insulative and highly thermally conductive. FIG. 7B shows a detailed view of the connection between the semiconductor die 520, die attach pad 522, adhesive 701 and heat slug 400 according to this embodiment of the invention.

Figure 8:
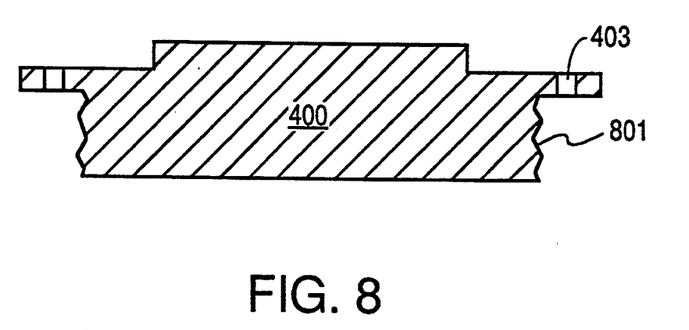
FIG. 8 is a cross-sectional view of a heat slug according to another embodiment of the invention.

FIG. 8 shows a detailed view of the heat slug 400 according to an alternative embodiment of the invention. In this embodiment, the surface 801 of the heat slug 400 is roughened a predetermined amount by etching, sandblasting, rough plating, black oxide or other method. Roughened in this way, surface 801 provides a better bond between the encapsulant 601 and heat slug 400 than if the surface 801 was not roughened. Further, the roughened surface 801 provides a lengthened interface between heat slug 400 and encapsulant 601 that helps reduce the influx of contaminants to the interior of the package through the path along the slug/encapsulant interface.

Various embodiments of the invention have been described. The descriptions are intended to be illustrative, not limitative. Thus, it will be apparent to one skilled in the art that certain modifications may be made to the invention as described without departing from the scope of the claims set out below.

We claim:
1. A structure, comprising:
   a semiconductor die;
   a leadframe comprised of a die attach pad and a plurality of electrically conductive leads, wherein:
      the leads are formed around a circumference of and are electrically isolated from the die attach pad; and
      the die attach pad has first and second surfaces, the first surface attached to a surface of the semiconductor die, the second surface being opposite the first surface; a heat slug including:
      a base section having a first base surface and a second base surface opposite the first base surface, a plurality of fins formed on a surface perpendicular to the first and second base surfaces at spaced apart locations around the circumference of the base section;
      a first raised section formed on the first base surface having a die attach pad attachment surface parallel to and raised with respect to the first base surface, the die attach pad attachment surface attached to the second surface of the die attach pad; and
      a second raised section formed on the second base surface having a primary heat transfer surface parallel to and raised with respect to the second base surface, a surface of the second raised section that is perpendicular to the primary heat transfer surface being roughened; and
   insulating material encapsulating the semiconductor die, leadframe and heat slug such that the primary heat transfer surface of the heat slug is exposed to the exterior of the insulating material and such that the insulating material interlocks with the roughened surface of the second raised section;
2. A structure as in claim 1, wherein the heat slug is made of oxygen-free high-conductivity copper.
3. A structure as in claim 1, wherein at least one slot is formed through the base section of the heat slug to extend from the first base surface to the second base surface.

4. A structure as in claim 1, further comprising an adhesive material that attaches the die attach pad attachment surface of the heat slug to the second surface of the die attach pad.

5. A structure as in claim 1, formed by a method comprising the steps of:
attaching the semiconductor die to the first surface of the die attach pad;
disposing the semiconductor die and leadframe in a mold cavity formed in a mold having first and second halves;
restraining an outer portion of the leadframe by mounting it to the first half of the mold at a location outside the mold cavity;
disposing the heat slug in the mold cavity such that the die attach pad attachment surface of heat slug is adjacent to the second surface of the die attach pad;
pressing the second half of the mold against the primary heat transfer surface of the heat slug such that the heat slug is forced against the die attach pad and the leadframe exerts a force that holds the primary heat transfer surface of the heat slug against the corresponding surface of the mold cavity;
transferring the insulating material into the mold cavity while the primary heat transfer surface of the heat slug is held against the corresponding surface of the mold cavity such that a tight seal is maintained between the heat slug and mold cavity surface.

6. A structure as in claim 5, wherein the heat slug is self-aligning such that when the heat slug is disposed within the mold cavity, the heat slug is oriented properly with respect to the die attach pad.

7. A structure, comprising:
a semiconductor die, the die having a plurality of die contact pads located on a first surface of the die and a second surface opposite the first surface;
a leadframe comprised of a die attach pad, a plurality of tie bars and a plurality of electrically conductive leads, wherein:
the tie bars and the leads are formed around a circumference of the die attach pad;
an inner end of each tie bar is connected to the die attach pad;
an inner end of each lead is adjacent to and electrically isolated from the die attach pad; and
the die attach pad has first and second surfaces, the first surface attached to the second surface of the semiconductor die, the second surface being opposite the first surface;
a plurality of electrically conductive bond wires, each bond wire connecting a die contact pad to the inner end of one of the leads;
a heat slug including:
a base section having a first base surface and a second base surface Opposite the first base surface, a plurality of fins formed on a surface perpendicular to the first and second base surfaces at spaced apart locations around the circumference of the base section;
a first raised section formed on the first base surface having a die attach pad attachment surface parallel to and raised with respect to the first base surface, the die attach pad attachment surface attached to the second surface of the die attach pad; and
a second raised section formed on the second base surface having a primary heat transfer surface parallel to and raised with respect to the second base surface, a surface of the second raised section that is perpendicular to the primary heat transfer surface being roughened; and
an insulating material encapsulating the semiconductor die, leadframe, bond wires and heat slug such that the primary heat transfer surface of the heat slug is exposed to the exterior of the insulating material, and such that the insulating material interlocks with the roughened surface of the second raised section.

8. A structure as in claim 7, wherein the heat slug is made of oxygen-free high-conductivity copper.

9. A structure as in claim 7, wherein
at least one slot is formed through the base section of the heat slug to extend from the first base surface to the second base surface.

10. A structure as in claim 7, further comprising an adhesive material that attaches the die attach pad attachment surface of the heat slug to the second surface of the die attach pad.

11. A structure as in claim 7, formed by method comprising the steps of:
attaching the semiconductor die to the first surface of the die attach pad;
connecting one end of each bond wire to a die contact pad and the other end of each bond wire to the inner end of a lead;
disposing the semiconductor die, leadframe and bond wires in a mold cavity formed in a mold having first and second halves;
restraining an outer portion of the leadframe by mounting it to the first half of the mold at a location outside the mold cavity;
disposing the heat slug in the mold cavity such that the die attach pad attachment surface of the heat slug is adjacent to the second surface of the die attach pad;
pressing the second half of the mold against the primary heat transfer surface of the heat slug such that the heat slug is forced against the die attach pad and the tie bars exert a force that holds the primary heat transfer surface of the heat slug against the corresponding surface of the mold cavity;
transferring the insulating material into the mold cavity while the primary heat transfer surface of the heat slug is held against the corresponding surface of the mold cavity such that a tight seal is maintained between the heat slug and mold cavity surface.

12. A structure as in claim 11, wherein the heat slug is self-aligning such that when the heat slug is disposed within the mold cavity, the heat slug is oriented properly with respect to the die attach pad.

13. A structure, comprising:
a semiconductor die, the die having a plurality of die contact pads located on a first surface of the die and a second surface opposite the first surface;
a leadframe comprised of a die attach pad, a plurality of tie bars and a plurality of electrically conductive leads, wherein:
the tie bars and the leads are formed around a circumference of the die attach pad;

an inner end of each tie bar is connected to the die attach pad;

an inner end of each lead is adjacent to and electrically isolated from the die attach pad; and the die attach pad has first and second surfaces, the first surface attached to the second surface of the semiconductor die;

a plurality of electrically conductive bond wires, each bond wire connecting a die contact pad to the inner end of one of the leads;

an oxygen-free high-conductivity copper heat slug comprising:

a base section having a first base surface and a second base surface opposite the first base surface;

a first raised section formed on the first base surface having a die attach pad attachment surface parallel to and raised with respect to the first base surface, the die attach pad attachment surface attached to the second surface of the die attach pad;

a second raised section formed on the second base surface having a primary heat transfer surface parallel to and raised with respect to the second base surface;

at least one surface of the second raised section that is perpendicular to the primary heat transfer surface being roughened;

at least one slot formed through the base section of the heat slug to extend from the first base surface to the second base surface; and a plurality of fins formed on a surface perpendicular to the first and second base surfaces at spaced apart locations around the circumference of the base section; and insulating material encapsulating the semiconductor die, leadframe, bond wires and heat slug such that the primary heat transfer surface of the heat slug is exposed to the exterior of the insulating material, and such that the insulating material interlocks with the roughened surface of the second raised section.

14. A heat slug, comprising:

a base section having a first base surface and a second base surface opposite the first base surface, a plurality of fins formed on a surface perpendicular to the first and second base surfaces at spaced apart locations around the circumference of the base section;

a first raised section formed on the first base surface having a die attach pad attachment surface parallel to and raised above the first base surface; and a second raised section formed on the second base surface and having a primary heat transfer surface parallel to and raised above the second base surface, a surface of the second raised section that is perpendicular to the primary heat transfer surface being roughened.

15. A heat slug as in claim 14 wherein the heat slug is made of oxygen-free high-conductivity copper.

16. A heat slug as in claim 14, further comprising at least one slot formed through the heat slug from the first base surface to the second base surface at a location near the periphery of the heat slug.

* * * * *

UNITED STATES PATENT AND TRADEMARK OFFICE
CERTIFICATE OF CORRECTION

PATENT NO.    :  5,381,042                    Page 1 of 2
DATED         :  January 10, 1995
INVENTOR(S)   :  Steve P. Lerner and David S. Razu It is certified that error appears in the above-identified patent and that said Letters Patent is hereby corrected as shown below:

In Column 1, line 39, delete "several" and insert --Several--;

In Column 2, line 4, delete "a" and insert --an exploded--;

In Column 2, line 18, delete "301" and insert —300b—

In Column 3, line 10, delete "in" and insert --In--;

In Column 5, line 1, delete "chase";

In Column 5, line 6, after "404" insert --(Figs. 4A and 4B)--; (1st. occurrence)

In Column 7, line 60, Claim 7, delete "Opposite" and insert --opposite--;

UNITED STATES PATENT AND TRADEMARK OFFICE
CERTIFICATE OF CORRECTION

PATENT NO.    : 5,381,042
DATED         : January 10, 1995
INVENTOR(S)   : Steve P. Lerner and David S. Razu It is certified that error appears in the above-identified patent and that said Letters Patent is hereby corrected as shown below:

In Column 8, line 32, Claim 11, after "lead;" insert
--disposing the heat slug in a mold cavity formed in a mold having first and second halves;
    disposing the semiconductor die, leadframe and bond wires in the mold cavity such that the first surface of the heat slug is adjacent to the second surface of the die attach pad;--

In Column 8, lines 34-36, Claim 11, delete these lines;

In Column 8, lines 40-43, Claim 11, delete these lines;

In Column 8, line 49, Claim 11, after "cavity" insert --and--;

In Figure 3 change "221" to --201--.

Signed and Sealed this

Twenty-third Day of April, 1996

BRUCE LEHMAN

*Attest:*

*Attesting Officer*    Commissioner of Patents and Trademarks